United States Patent [19]

Leseure et al.

[11] Patent Number: 4,638,167

[45] Date of Patent: Jan. 20, 1987

[54] INSULATOR CIRCUIT WITH AN OPTOELECTRONIC COUPLER

[75] Inventors: Jean-Yves Leseure, 7A rue PaPu, Rennes 35000; Charbonnel Pierre; Christian Laure, both of Betton, all of France

[73] Assignees: Jean-Yves Leseure, Rennes; Etablissement Public de Diffusion Dit "Teledifusion de France", Montrouge, both of France

[21] Appl. No.: 652,306

[22] Filed: Sep. 19, 1984

[30] Foreign Application Priority Data

Sep. 20, 1983 [FR] France .................. 83 14920

[51] Int. Cl.$^4$ ............................................. G02B 27/00
[52] U.S. Cl. ....................................... 250/551; 455/602
[58] Field of Search ............... 250/551, 206, 214, 208; 307/311; 455/602, 617, 601, 608, 618; 330/59

[56] References Cited

U.S. PATENT DOCUMENTS

| | | | |
|---|---|---|---|
| 3,333,208 | 7/1967 | Hudak | 250/551 |
| 3,430,054 | 2/1969 | Klein | 250/551 |
| 3,810,034 | 5/1974 | Brunsch | 250/551 |
| 3,913,001 | 10/1975 | Kayama | 250/551 |
| 4,054,834 | 10/1977 | Boirat et al. | 455/602 |
| 4,386,371 | 5/1983 | George | 455/602 |

OTHER PUBLICATIONS

Electronics Engineering, "Faster Optically-Coupled Isolator is Compatible with TTL Interfaces", by P. Turner, vol. 46, No. 556, pp. 46–48, (Jun. 1974).

*Primary Examiner*—David C. Nelms
*Attorney, Agent, or Firm*—Michael N. Meller

[57] ABSTRACT

Insulator circuit comprising an optoelectronic coupler consisting of a photoemitting diode positioned facing the photodetector, a photoemitting diode polarizing circuit, a signal input connected to the photoemitting diode and an output amplifier connected to the photodetector, wherein the photoemitting diode polarizing circuit comprises a high frequency power supply connected to a high frequency transformer and a rectifier circuit inserted between said transformer and the photoemitting diode.

5 Claims, 6 Drawing Figures

INSULATOR CIRCUIT WITH AN OPTOELECTRONIC COUPLER

BACKGROUND OF THE INVENTION

The present invention relates to an insulator circuit with an optoelectronic coupler. It is used in electronics and particularly in the construction of analog or digital equipment. In connection with the latter, reference is e.g. made to audiofrequency digital encoders-decoders.

Audio radio broadcasting equipment, as well as most sound effects equipment, incorporate input and output transformers, whose function is to provide the electrical insulation between the different subassemblies of the audio frequency chain.

It is also known that an electrical insulation can be obtained by optoelectronic couplers. These devices incorporate a photoemitting diode positioned in front of a photodetector, a photoemitting diode polarizing circuit and an output amplifier connected to the photodetector.

Each of these two devices suffer from disadvantages. Due to their high cost, insulating transformers are only used in the professional field (radio broadcasting, production, measurements) or semiprofessional field (sound effects). The components having a professional-type performance level (high regularity of the pass band, low distortion) are particularly onerous, particularly if they have to accept a high signal amplitude of approximately 20 dB. For such levels, the distortion at low frequencies quickly becomes prohibitive, due to the saturation of the magnetic core, unless the casing volume is increased.

For information purposes, a professional insulating transformer with an impedance of 600Ω occupies a volume of 0.2 to 0.4 liter and its price in 1983 was between 400 and 600 French francs. As a result of the technology used, this price can only increase.

Although optoelectronic couplers do not have these disadvantages, it is necessary to stress that the presence of a continuous polarization of the emitting diode constitutes a considerable constraint in the case of equipment having several inputs. It is then necessary to have one supply line per input, which is disadvantageous. Moreover, the standard circuit diagram of this component does not ensure the compatibility with the possibly used magnetic insulating transformers, to the extent that the polarization of the emitting diode must be ensured by the upstream circuit.

SUMMARY OF THE INVENTION

The object of the invention is to obviate this disadvantage by proposing an optoelectronic circuit able to replace high-impedance input transformers, particularly in audiofrequency equipment. This circuit performs the same functions as an insulating transformer with at least equal dynamics, smaller overall dimensions and lower cost.

To this end, the invention makes use of an optoelectronic coupler, whose polarizing circuit is special and of the high-frequency type. Thus, there is no need for a special supply line for each of the audiofrequency inputs in order to polarize the diodes of the couplers used.

Thus, the present invention relates to an insulator circuit comprising an optoelectronic coupler consisting of a photoemitting diode positioned facing a photodetector, a photoemitting diode polarizing circuit, a signal input connected to the photoemitting diode and an output amplifier connected to the photodetector, wherein the photoemitting diode polarizing circuit comprises a high-frequency power supply connected to a high-frequency transformer and a rectifier circuit inserted between the transformer and the photoemitting diode.

According to a first embodiment, the rectifier circuit comprises a diode or diode bridge and a capacitor.

According to another embodiment, the polarizing circuit comprises a resistor and a capacitor.

According to an advantageous variant, the high-voltage power supply is constituted by means belonging to the equipment on which the insulator circuit is installed.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENTS

Figure 1:
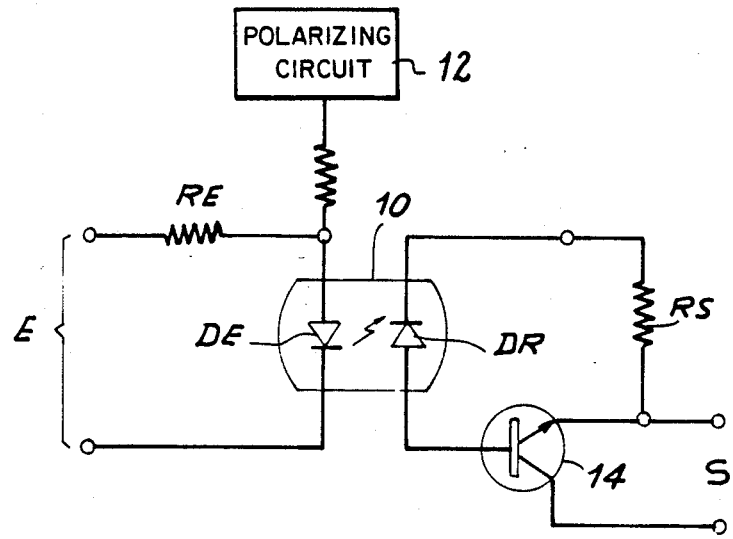
FIG. 1 shows a prior art optoelectronic insulator.

The insulator circuit of FIG. 1 is of the type comprising an optoelectronic coupler 10, constituted by an emitting diode DE facing a photoreceiving diode DR, a polarizing circuit 12 for the emitting diode DE, a signal input E connected to the emitting diode by a resistor RE and an output amplifier 14 connected to the photoreceiving diode by an output resistor RS and a signal output S.

Figure 2:
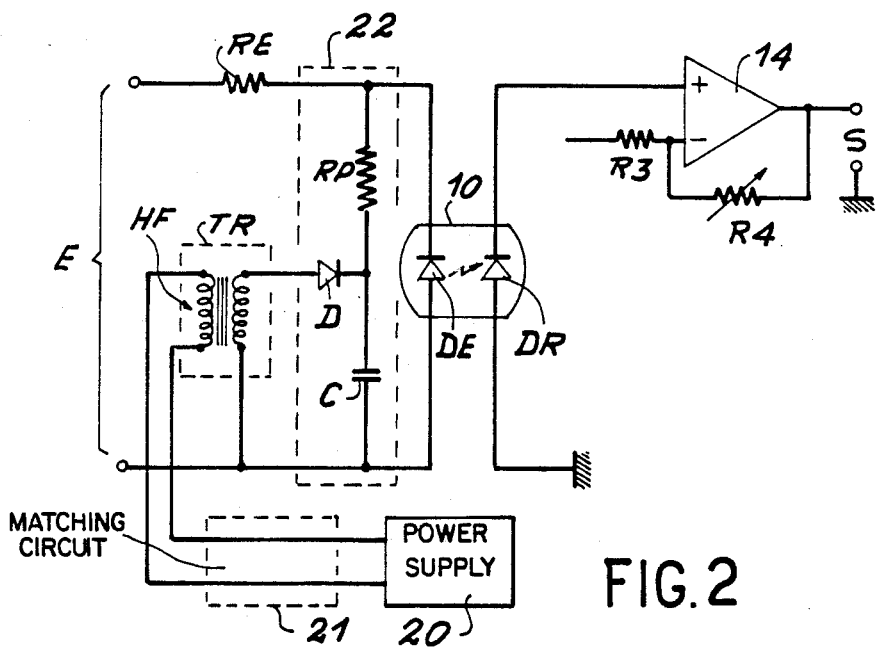
FIG. 2 shows an insulator circuit according to the invention.

The originality of the circuit according to the invention results from the structure of the polarizing circuit, which is illustrated in FIG. 2. The insulator has a circuit for polarizing the photoemitting diode DE which comprises a high-voltage power supply 20 connected to a high-frequency transformer TR and a rectifier circuit 22 inserted between the transformer and the photoemitting diode. As shown in FIG. 2, the rectifier circuit 22 comprises a diode D, a capacitor C and a resistor RP.

The polarizing circuit has the following operating principle. The low-impedance transformer TR transmits the high-frequency polarizing signal to the rectifier circuit. The frequency used is typically between 2 and 20 MHz. A five-pin DIL size transformer of type MCL T4-1 is adequate. Moreover, through using a high frequency, the advantage is obtained, compared with the conventional floating supply, of producing no parasitic ripple in the audiofrequency spectrum.

It is possible to use a simpler rectifier circuit by eliminating diode D. A simple integrating circuit with a resistor and a capacitor can be inserted between the transformer and the emitting diode. The only condition to be respected is that the high cutoff frequency $f_A$ of the audiospectrum must be well below $1/(2\pi RC)$, where R and C are the values of the resistive and capacitive elements.

However, this very simple circuit with a resistor and a capacitor suffers from the disadvantage of requiring more energy than the first-mentioned circuit with the diode and consequently preference is given to the former.

In certain cases, it is possible to use a matching circuit 21 (shown in broken line form in FIG. 2) for reasons of compatibility between power supply 20 and the remainder of the circuit. For example, it can be a TTL buffer circuit.

The amplifier 14 can be of the voltage-voltage type and has a high gain. Resistor RP makes it possible to regulate the polarizing current of diode DE and resistor R4 the gain of the complete circuit. These two resistances are a function of the electrooptical circuit used. For example, it is possible to use an optoelectronic coupler 6N135, a resistor RP of 350Ω, a resistor R3 of 1.2 kΩ and a resistor R4 of 5 MΩ. Transformer TR can be of the type MCL T4-1 marketed by Mini-Circuits and the high-frequency power supply of type VF 180 marketed by Valpey Fisher. It is also possible to use an emitting diode operating in the infrared range and a PIN-type receiving diode.

According to an advantageous variant, the oscillator circuit is constituted by means in the digital equipment in which the insulator is installed.

Figure 3:
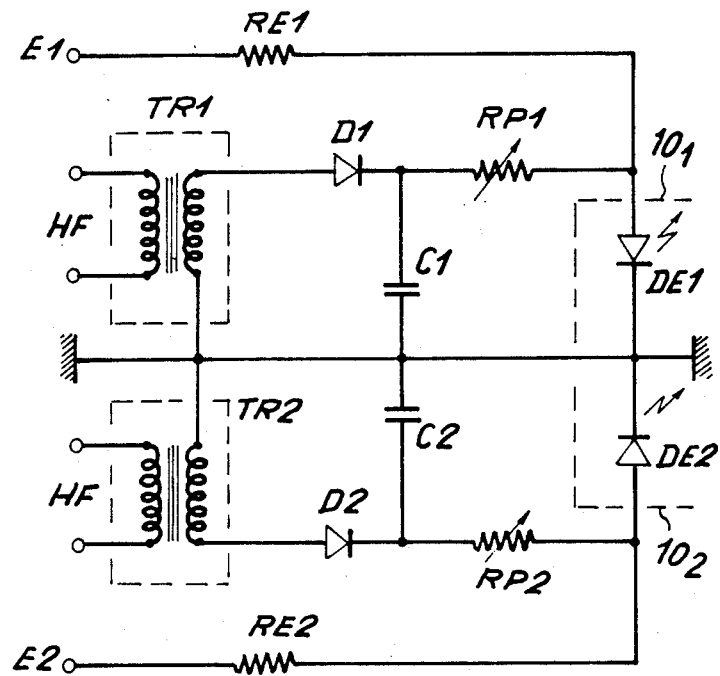
FIG. 3 shows a variant having symmetrical inputs and separate rectifier circuits.
Figure 4:
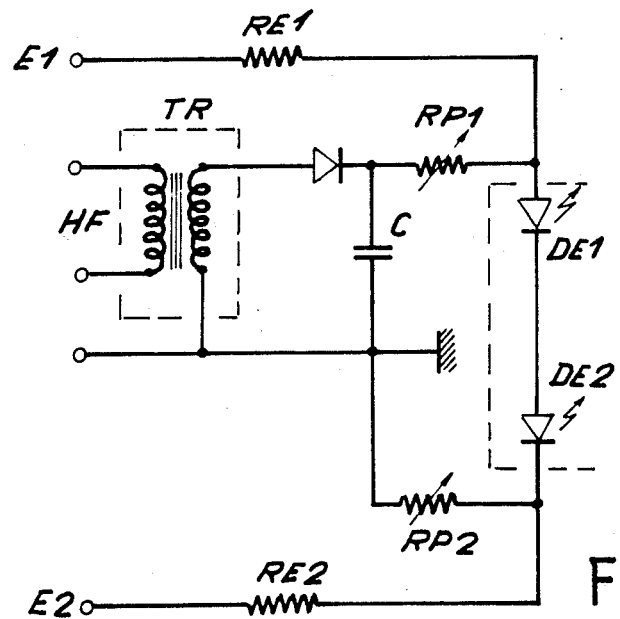
FIG. 4 shows a variant having symmetrical inputs and a common rectifier circuit.

The invention permits connections with symmetrical inputs on using two opto-couplers 10/1 and 10/2 defining two separate channels, the symmetrical input having a high point E1 and a low point E2. This input is identical to that of a symmetrical transformer. The polarization of each emitting diode can be obtained by separate circuits (FIG. 3) or a common circuit (FIG. 4), as a function of the type of components used and the necessary power levels. In the two illustrated variants, the represented elements carry the same references as in FIG. 2, but with numbers 1 and 2, depending on whether they belong to the high channel or the low channel.

Figure 5:
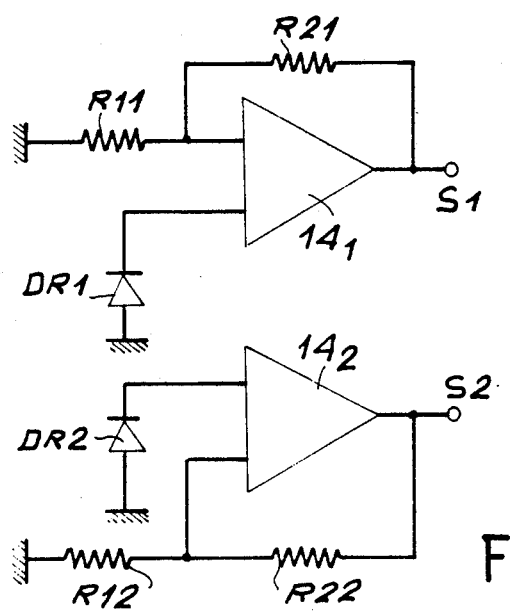
FIG. 5 shows a symmetrical output circuit.

The circuit outputs can also be symmetrical (FIG. 5) with an input S1 (high point) and an output S2 (low point), the output circuit then has a double amplifier 14/1, 14/2 connected to the receiving diodes DR1, DR2 and resistors R11, R21 and R12, R22.

Figure 6:
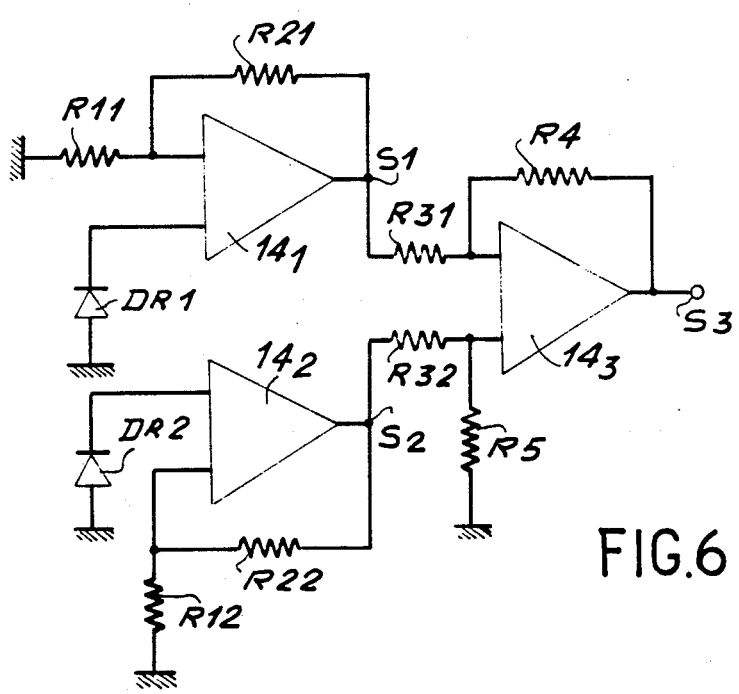
FIG. 6 shows an asymmetrical output circuit.

The output can be made asymmetrical (FIG. 6) by adding a third amplifier 14/3 with output S3, provided with two inputs connected to outputs S1, S2.

In a variant according to FIG. 2, the following results are obtained for an input level of −10 dB (corresponding to the sound effects line level):

harmonic distortion of rank 2: 0.3% (50 db) from 20 Hz to 20 kHz, signal-to-noise ratio: 80 dB from 20 to 20,000 Hz.

What is claimed is:

1. An insulator circuit comprising an optoelectronic coupler consisting of a photoemitting diode positioned facing a photodetector, a photoemitting diode polarizing circuit, an audiofrequency signal input connected to the photoemitting diode and an output amplifier connected to the photodetector, wherein the photoemitting diode polarizing circuit comprises a high frequency power supply, said high frequency being in the range 2-20 MHz, a high frequency transformer connected to said power supply, and a rectifier circuit with two inputs connected to said transformer and two outputs connected to said photoemitting diode.

2. An insulator circuit according to claim 1, wherein the rectifier circuit comprises at least one diode and a capacitor.

3. An insulator circuit according to claim 1, wherein the rectifier circuit comprises an integrating circuit constituted by a resistor and a capacitor.

4. An insulator circuit comprising first and second couplers consisting respectively of first and second photoemitting diodes positioned facing first and second photodetectors, first and second photoemitting diode polarizing circuits, and an audio signal input connected to the first and second photoemitting diodes and first and second output amplifiers respectively connected to the first and second photodetectors, wherein the first and second photoemitting diode polarizing circuits comprise respectively first and second high-frequency power supplies, said high frequency being in the range 2-20 MHz, first and second high-frequency transformers respectively connected to said supplies, and first and second rectifier circuits with two inputs connected to said first and second transformers and two outputs connected to said first and second emitting diodes.

5. An insulator circuit comprising first and second optoelectronic couplers consisting respectively of first and second photoemitting diodes positioned facing first and second photodetectors, a photoemitting diode polarizing circuit, an audio signal input connected to the first and second photoemitting diodes and first and second output amplifiers connected to the first and second photodetectors, wherein the photoemitting diode polarizing circuit comprises a high-frequency power supply, said high frequency being in the range 2-20 MHz, a high-frequency transformer respectively connected to said supply, and a rectifier circuit with two inputs connected to said transformer and two outputs connected to said first and second emitting diodes.

* * * * *